(12) United States Patent
Aki et al.

(10) Patent No.: US 6,582,820 B2
(45) Date of Patent: Jun. 24, 2003

(54) COMPOSITE PLATE-LIKE METAL TITANATE AND PRODUCTION METHOD THEREOF

(75) Inventors: Minoru Aki, Tokushima (JP); Harue Matsunaga, Tokushima (JP); Tomohiro Tanaka, Tokushima (JP); Toshiaki Yagi, Tokushima (JP)

(73) Assignee: Otsuka Chemical Co., Ltd., Osaka (JP)

( * ) Notice: Subject to any disclaimer, the term of this patent is extended or adjusted under 35 U.S.C. 154(b) by 5 days.

(21) Appl. No.: 09/807,884

(22) PCT Filed: Mar. 9, 2001

(86) PCT No.: PCT/JP01/01853

§ 371 (c)(1),
(2), (4) Date: Nov. 13, 2001

(87) PCT Pub. No.: WO01/68528

PCT Pub. Date: Sep. 20, 2001

(65) Prior Publication Data

US 2002/0172828 A1 Nov. 21, 2002

(30) Foreign Application Priority Data

Mar. 13, 2000 (JP) .......................................... 2000-068874

(51) Int. Cl.$^7$ .................................................. B32B 5/16
(52) U.S. Cl. ..................................... 428/403; 428/409
(58) Field of Search .................................. 428/403, 404

(56) References Cited

FOREIGN PATENT DOCUMENTS

| | | | |
|---|---|---|---|
| EP | 0048536 | * | 3/1982 |
| JP | 100035617 | * | 4/1998 |

* cited by examiner

Primary Examiner—Leszek Kiliman
(74) Attorney, Agent, or Firm—Townsend & Banta

(57) ABSTRACT

A composite plate-shaped metal titanate having a composition expressed in $MO \cdot TiO_2$ (wherein M denotes a divalent metal) in which a surface of crystalline metal titanate is partially or entirely coated with amorphous and/or crystalline $TiO_2$.

9 Claims, No Drawings

COMPOSITE PLATE-LIKE METAL TITANATE AND PRODUCTION METHOD THEREOF

BACKGROUND OF THE INVENTION

1. Field of the Invention

The present invention relates to a composite plate-like metal titanate and a production method thereof.

2. Related Art

A metal titanate such as barium titanate, strontium titanate, calcium titanate, and the like has widely been used as a material having dielectric, piezoelectric properties and industrially produced by mass production.

Conventionally, as the metal titanate, granular and fibrous ones have been proposed. Among them, since a fibrous metal titanate is capable of not only providing dielectric property to synthetic resin but also improving mechanical strength without deteriorating the molding workability of the resin by being mixed with the resin, it has been applied to a variety of uses, for example, as an antenna material, a capacitor material, a layered circuit substrate material, a connector material, and the like which are required to be dielectric.

However, although such a fibrous metal titanate does not deteriorate the molding workability of the synthetic resin as described above, it has the following problems attributed to the fibrous shape. That is, although it can improve the dielectric property as compared with a granular one in the case the longitudinal direction of the fiber is same as the direction of an electric field, it cannot improve the dielectric property so much as compared with a granular one in the case the diameter direction of the fiber is same as the direction of an electric field. Also, the fibrous metal titanate is not sufficient in the reinforcing capability to the force applied in the torsional direction.

On the other hand, a plate-like dielectric material has a characteristic of improving the dielectric constant regardless of the direction of an electric field owing to the intrinsic property of the shape. As such a plate-like dielectric material, Japanese Patent Laid Open No. Hei 10-95617 (1998) proposes plate-like substances of metal oxides such as magnesium, calcium, strontium, barium and the like and in an experiment example 3, plate-like alkaline earth metal salts were produced by mixing plate-like titanium oxide and alkaline earth metal hydroxides and hydrothermally treating the resulting mixtures. However, since the hydrothermal reaction was carried out while controlling the mole ratio of titanium and an alkaline earth metal to be 1/1 in the method, the strength of the obtained plate-like substance itself was deteriorated and, for example, the product was mixed with synthetic resin, some or all of the plate-like substance was broken by the external stress applied at the time of mixing or kneading to make it impossible to obtain desired mechanical strength and dielectric property.

SUMMARY OF THE INVENTION

Inventors of the present invention have enthusiastically investigated to solve the above described problems and consequently succeed in obtaining an innovative composite plate-like metal titanate having high strength itself and excellent in dielectric property and complete the present invention.

That is, the present invention relates to a composite plate-like metal titanate in which a surface of crystalline metal titanate having a composition expressed in $MO.TiO_2$ (wherein M denotes a divalent metal) is partially or entirely coated with amorphous and/or crystalline $TiO_2$ and relates to a production method thereof.

According to the present invention, a composite plate-like metal titanate having high strength as compared with that of a conventional one and excellent in dielectric property can be provided by mixing a plate-like titanium oxide compound with one or more of metal compounds selected from oxides, hydroxides, inorganic acid salts, and organic acid slats of a divalent metal element M in Ti>M by mole ratio and carrying out heating treatment of the mixture at 500° C. to 1,400° C.

The reason why the composite plate-like metal titanate of the present invention has high strength itself has not been made clear yet, however, it is supposed that amorphous and/or crystalline $TiO_2$ works as a matrix in some or all of its surface as described above.

The composite plate-like metal titanate of the present invention is a plate-like substance in which a surface of crystalline metal titanate having a composition expressed in $MO.TiO_2$ (wherein M denotes a divalent metal) is partially or entirely wrapped with amorphous and/or crystalline $TiO_2$.

In this case, although the divalent metal denoted with M is not particularly restricted, examples are alkaline earth metals such as barium, strontium, calcium, magnesium and the like; elements such as manganese, zinc, copper, lead, cobalt, nickel and the like belonging to the fourth period in a periodic table; and elements such as silver, tin, molybdenum, niobium, zirconium and the like belonging to fifth period in a periodic table. Among them, preferable are alkaline earth metals and elements such as lead belonging to fourth period in a periodic table and especially preferable are alkaline earth metals. The divalent metal denoted with M is not necessarily to be a single type but may be a mixture of two or more metals.

Among composite plate-like metal titanates of the present invention, especially preferable are composite plate-like alkaline earth metal titanates such as composite plate-like barium titanate, composite plate-like strontium titanate and composite plate-like calcium titanate and composite plate-like lead titanate.

In this specification, the term, plate-like, includes flaky, scaly, micaceous shapes and the like.

The composite plate-like metal titanate of the present invention has the average major axial size of generally about 0.5 to 100 µm, preferably 1 to 20 µm; the average minor axial size of generally about 0.2 to 100 µm, preferably 0.5 to 20 µm; the average thickness of generally about 0.01 to 10 µm, preferably 0.05 to 5 µm according to the observation by a scanning type electron microscope. Also, the ratio (the average particle diameter/the average thickness) of the average particle diameter measured by a laser diffraction type particle size distribution meter and the average thickness measured by a scanning type electron microscope is about 3 to 100, preferably about 5 to 50.

The composite plate-like metal titanate of the present invention can be produced by mixing plate-like titanium oxide with one or more of metal salts selected from oxides, hydroxides, inorganic acid salts, and organic acid slats of a divalent metal element M in Ti>M by mole ratio and heating the mixture at 500° C. to 1,400° C.

In the above description, the preferable mole ratio of Ti and M, M:Ti=1:(1.02 to 1.67). If the ratio of Ti is too high, the dielectric dissipation factor becomes high and therefore it is not preferable, whereas if the ratio of Ti is too low, the strength of the aimed product become insufficient and therefore it is not preferable. Especially, if a low dielectric dissipation factor is required, it is preferable that M:Ti=1: (1.03 to 1.11).

Further, the preferable range of heating temperature is 600° C. to 1,100° C. If the heating treatment temperature is lower than 600° C., the crystallinity of $MO \cdot TiO_2$ is inferior and if it is higher than 1,100° C., crystal growth of titanium oxide of matrix takes place and the dielectric dissipation factor is increased and at the same time the resulting product becomes a plate-like substance with a low strength and therefore it is not preferable.

According to the production method, a composite plate-like metal titanate with approximately even shape within a narrow dispersion of the particle distribution is obtained.

The plate-like titanium oxide, one of the raw materials, is not particularly restricted and can be produced according to known methods disclosed in, for example, Japanese Patent Publication No. Hei 6-88786 (1994), Japanese Patent Laid Open No. Hei 5-221795 (1993), Japanese Patent Laid Open No. Hei 10-95617 (1998), Japanese Patent Application No. Hei 11-158086 (1999).

One of the examples is a method comprising a step of acid treating a lepidocrosite-type plate-like crystalline metal titanate and a step of firing the resulting crystal.

The above-described titanium oxide may contain or keep an alkali metal, an alkaline earth metal, and other components within a range in which the effects of the present invention are not deteriorated.

In the present invention, the above-described plate-like titanium oxide may be used as a raw material as it is or those which are further fired at 200 to 1,000° C., preferably 300 to 900° C., may be used.

There is no particular restriction to the divalent metal salts to be reacted with the plate-like titanium oxide and usable are oxides; hydroxides; inorganic acid salts, e.g. carbonates, nitrates, sulfates, and chlorides; and organic acid salts, e.g. oxalates, acetates and the like of alkaline earth metals such as barium, strontium, calcium, magnesium and the like; elements belonging to the fourth period of a periodic table, such as manganese, zinc, copper, lead, cobalt, nickel and the like; and elements belonging to the fifth period of a periodic table, such as silver, tin, molybdenum, niobium, zirconium and the like.

The reaction of the plate-like titanium oxide and divalent metal salts can be carried out by, for example, a firing method, a wet type precipitation firing method, a flux method, and the like.

For example, according to the firing method, the plate-like titanium oxide and one or more of oxides, hydroxides, inorganic acid salts, and organic acid salts of divalent metals are evenly mixed in an aimed M/Ti (mole ratio) by a mixer or the like and then the resulting mixture is fired to obtain an aimed product.

Further, according to the wet type precipitation firing method, at first, carbonates of divalent metals are adsorbed on the plate-like titanium oxide by a solution reaction. Other than the carbonates, dicrbonates and hydrogen carbonate compounds are usable, however carbonates are most preferable. The use ratio of the plate-like titanium oxide and divalent metal carbonates may be controlled to be the same ratio as M/Ti (mole ratio) of the aimed composite plate-like metal titanate.

In order to precipitate the carbonates, either a solution of divalent metal carbonates or a solution containing salts of divalent metals other than carbonates and a solution containing the carbonate ions are added to the solution in which the plate-like titanium oxide is dispersed while being stirred. At that time, it is preferable to control the pH of the plate-like titanium oxide dispersion solution to be weakly alkaline, 8 to 10. The precipitation reaction is carried out at a temperature around 20 to 80° C. The divalent metal salts are not particularly restricted, however, usable are, for example, hydroxides, halides, nitrates, acetates, formates, oxalates and the like. They may be used solely or in combination of two or more of them. Examples as a solution containing carbonate ion are solutions containing ammonium carbonate, ammonium bicarbonate, ammonium hydrogencarbonate carbamate, and the like. Further, in place of the solution containing carbonate ion, carbonic acid gas may directly be introduced.

Next, the plate-like titanium oxide on which the carbonates are precipitated is separated by filtration, washing with water, drying method and then carried out heating treatment at a prescribed temperature to obtain a composite plate-like metal titanate of the present invention. To carry out heating treatment, a common heating furnace such as an electric furnace, a gas burner furnace, a high frequency furnace and the like can be used. The composite plate-like metal titanate obtained in such a manner maintains approximately the same shape as that of the plate-like titanium oxide, one of the raw materials. The obtained product can be used as it is for a variety of uses, however based on necessity, it may be subjected further to treatment such as washing with water, washing with an acid, classifying, or cracking.

Further, the composite plate-like metal titanate of the present invention can be produced by a flux method. That is, the plate-like titanium oxide and divalent metal salts are carried out heating treatment at a prescribed temperature in the presence of fluxes to obtain the composite plate-like metal titanate. In this case, usable as the divalent metal salts are divalent metal oxides and the salts capable of forming oxides by heating treatment. The salts maybe, for example, carbonates, nitrates, hydroxides and the like. These salts can be used solely or in combination of two or more of them. Examples of the fluxes are alkali metal chlorides such as sodium chloride, potassium chloride and the like; alkali metal bromides such as sodium bromide, potassium bromide and the like; and alkali metal sulfides such as sodium sulfide, potassium sulfide an the like. The fluxes may be used solely or in combination of two or more of them. The use amounts of the fluxes are not particularly restricted and may properly be selected depending on a variety of conditions such as the respective amounts of the plate-like titanium oxide and the divalent metal salts to be used, kinds of the divalent metals, the heating treatment temperature, heating treatment duration, and the uses of the obtained plate-like products and generally, they may be controlled to be about 10 to 1,000 parts by weight, preferably 20 to 700 parts by weight, to 100 parts by weight in total of the plate-like titanium oxide and the divalent metal salts. After the heating treatment, based on necessity, common treatment such as washing with water, washing with an acid, fibrillation, drying and the like may be carried out to obtain the composite plate-like metal titanate of the present invention.

Further, the composite plate-like metal titanate of the present invention may be added with other elements at the time of its production in order to improve other physical properties. For example, in the case of lowering the temperature dependence of the dielectric property, for example, silica, neodymium, bismuth, tantalum or the like may be added.

The composite plate-like metal titanate of the present invention can be mixed to synthetic resin in order to provide the synthetic resin with, for example, various properties such as dielectric property and further high mechanical strength. Addition of a composite plate-like alkali earth titanate, for example, a composite plate-like barium titanate and a composite plate-like calcium titanate, remarkably improves the dielectric constant of the synthetic resin regardless of the electric field direction and provides the resin with considerably high mechanical strength. In this case, the synthetic resin is not particularly restricted and any types of known thermoplastic resin and thermosetting resin can be used. Practical examples of the thermoplastic resin are polyethylene, polypropylene, polyisoprene, polybutadiene, polyethylene chloride, polyvinyl chloride, styrene resin, impact resistant polystyrene, acrylonitrile-styrene resin (AS resin), acrylonitrile-butadiene-styrene resin (ABS resin), methyl methacrylate-butadiene-styrene resin (MBS resin), methyl methacrylate-acrylonitrile-butadiene-styrene resin (MABS resin), acrylonitrile-acrylic rubber-styrene resin (AAS resin), polymethyl (meth)acrylate, polycarbonates, modified polyphenylene ether (PPE), polyamide (aliphatic system and/or aromatic system), polyester (polyethylene terephthalate, polybutylene terephthalate, polyethylene naphthalate, and the like), polyphenylene sulfide, polyimides, polyether ether ketones, polysulfones, polyarylates, polyether ketones, polyether nitrites, polythioether sulfones, polyether sulfones, polybenzimidazole, polycarbodimides, polyamide imides, polyether imides, liquid crystal polymers, composite plastics and the like. Practical examples of the thermosetting resin are polyurethanes, phenol resin, melamine resin, urea resin, unsaturated polyester resin, diallyl phthalate resin, silicon resin, epoxy resin and the thermosetting resins of their mixture.

The resin composition containing the composite plate-like metal titanate of the present invention may contain a variety of conventionally well-known resin additives in proper combinations unless the excellent properties are lost. As the resin additives, usable are, for example, an antioxidants, a drip preventing agent (a dropping preventing agent, for example, fluoro resin), a fire retardant (organic phosphorus compounds, phosphazene compounds and the like), a fire retardation assisting agent, an inorganic filler, a UV absorbent, a photostabilizer, a light shielding agent, a metal inactivation agent, a quencher, a heat resistant stabilizer, a lubricant, a release agent, a coloring agent, an antistatic agent, an antioxidant, a plasticizer, an impact strength improper, a compatibility improper and the like. Further, a variety of conventionally known additives may be added in order to provide antifogging, antimold, antibacterial properties and other functions.

The resin composition can be obtained by measuring prescribed or proper amounts of the composite plate-like metal titanate and other resin additives based on necessity and adding them to synthetic resin and then mixing and kneading the resulting mixture by well known methods. For example, a mixture of a respective components in powder, beads, flakes, or pellet-like state is kneaded by an extruder such as an uniaxial extruder, a biaxial extruder, a kneader such as a Banbury mixer, a pressure kneader, two rolls and the like to obtain the resin composition of the present invention. In case that it is also necessary to add the liquid, it can be kneaded by the above-described extruder or kneader with well known liquid pouring device.

A resin molded body can be obtained by molding the resin composition. For example, not only an extrusion molded product such as a resin plate, sheet, film, or irregularly formed product can be produced by employing conventionally well-known molding means for press molding, injection molding, extrusion molding and the like, but also a resin plate with a double or triple layer structure can be produced by employing a co-extrusion kneader and the like.

A molded product obtained in such a manner can be employed for, for example, a mobile phone, antenna materials for ITS, GPS, wireless LAN, an layered circuit substrate, an injection molded substrate, a high frequency substrate, a variety of types of capacitors, a high speed connector and the like.

DESCRIPTION OF THE PREFERRED EMBODIMENTS

Hereinafter, the present invention will be described more particularly along with examples.

Reference example (Synthesis example of plate-like titanium oxide)

$LiNO_3$, $KNO_3$, and $TiO_2$ were mixed in proper ratios as to adjust K:Li:Ti:O=0.8:0.27:1.73:4 mole ratio as raw materials and further mixed with KCl as a flux in a ratio as to adjust the weight ratio (flux/raw materials)=0.7 to obtain a mixture and the mixture was sufficiently mixed in an aluminum mortar. A platinum crucible was filled with the mixed powder and heated from a room temperature to 900° C. in an electric furnace, a firing temperature, in 3 hours and fired at 900° C. for 6 hours. Next, the resulting product was cooled to 500° C. in 1 hour and to 300° C. or lower in another 1 hour, and then taken out the electric furnace and spontaneously cooled. The obtained product was immersed in water to dissolve the flux and the crystal was separated by filtration and dried after washed with water to obtain a crystal powder. The obtained crystal powder was observed by a scanning type electron microscope to find the obtained crystal was a plate-like $K_{0.8}Li_{0.27}Ti_{1.73}O_4$ crystal with the average major axial size 10 $\mu$m, the average minor axial size 8 $\mu$m, and the average thickness of 0.5 $\mu$m. The crystal was mixed and stirred in an aqueous 1 N nitric acid solution while the solid matter concentration being controlled to be 1% and reaction was carried out at a room temperature for 5 hours. On completion of the reaction, the resulting solution was separated by filtration and the solid material was dried to obtain plate-like titanium oxide as a raw material.

EXAMPLE 1

$CaCO_3$ and $CaCl_2$ were mixed in a mole ratio of 7:3 and pulverized and further the plate-like titanium oxide was added in amount as to adjust the mole ratio to be Ti:Ca=1.11:1 to obtain a mixture. The mixture was sufficiently mixed in a mixer. The resulting mixed powder was loaded to an alumina crucible and fired at 800° C. for 5 hours in an electric furnace. The obtained fired product was immersed in an aqueous 0.1 N nitric acid solution to dissolve soluble components and then separated by filtration and dried to obtain a product. The obtained product was observed by a scanning type electron microscope to find the product well maintain the shape of the raw material plate-like titanium oxide. Further, the product was analyzed by a fluorescent x-ray analyzer to find the composition ratio was Ti:Ca=1.12:1 and the product was found to be a composite plate-like calcium titanate containing 89% of crystalline $CaTiO_3$ and 11% of amorphous $TiO_2$ compounded and integrated with each other by x-ray diffraction.

EXAMPLE 2

Ba $(OH)_2.8H_2O$ and plate-like titanium oxide were mixed in a mole ratio of Ti:Ba=1.25:1 and further mixed with water as to control the plate-like titanium oxide concentration to be 2% and then stirred and dispersed in water at a room temperature. Carbonic acid gas was blown to the obtained aqueous solution and when the pH of the solution reached 7.5, the carbonic acid gas was stopped and the obtained product was separated by filtration. Further, the product was analyzed by a scanning type electron microscope and x-ray diffraction to find that the product was a plate-like titanium oxide bearing $BaO_3$ deposited on the surface. The mixture was loaded to an alumina crucible and fired at 950° C. for 5 hours in an electric furnace. The obtained fired product was immersed in an aqueous 0.1 N nitric acid solution to dissolve soluble components and then separated by filtration and dried to obtain a product. The obtained product was observed in the same manner as the Example 1 to find that the product had the composition ratio Ti:Ba=1.28:1 and was a composite plate-like barium titanate containing 78% of crystalline $BaTiO_3$ and 22% of amorphous $TiO_2$ compounded and integrated with each other.

EXAMPLE 3

$Ba(OH)_2 \cdot 8H_2O$ and $Sr(OH)_2 \cdot 8H_2O$ were mixed and pulverized in a mole ratio of 2:8 and further the plate-like titanium oxide was added in amount as to adjust the mole ratio to be Ti:M (Ba+Sr)=1.18:1 to obtain a raw material and further mixed with NaCl as a flux in amount as to control the weight ratio (flux/raw material) to be 0.5 to obtain a mixture. The resulting mixed powder was loaded to a platinum crucible and fired at 900° C. for 5 hours in an electric furnace. The obtained fired product was immersed in an aqueous 0.1 N nitric acid solution to dissolve soluble components and then separated by filtration and dried to obtain a product. The obtained product was observed in the same manner as the Example 1 to find that the product had the composition ratio Ti:M (Ba+Sr)=1.19:1 and was a composite plate-like barium strontium titanate containing 84% of crystalline (Ba, Sr) $TiO_3$ and 16% of amorphous $TiO_2$ compounded and integrated with each other.

EXAMPLES 4 TO 6

Composite plate-like metal titanates were obtained in the same manner as the Example 1 except that the raw material mole ratio and the firing temperature were changed and their compositions and the products phases were shown in Table 1. In Table 1, those which maintained the plate-like shape were marked with ○ in the shape retention column.

TABLE 1

|  | Ti:Ca (mole ratio) | Firing Temperature (° C.) × Time (hr) | Generated Phase | Shape Retention |
|---|---|---|---|---|
| Example 4 | 1.11:1 | 850° C. × 5 hours | Crystalline $CaTiO_3$ = 89% Amorphous $TiO_2$ = 6% Crystalline $TiO_2$ = 5% | ○ |
| Example 5 | 1.11:1 | 900° C. × 5 hours | Crystalline $CaTiO_3$ = 89% Crystalline $TiO_2$ = 11% | ○ |
| Example 6 | 1.03:1 | 800° C. × 5 hours | Crystalline $CaTiO_3$ = 97% Amorphous $TiO_2$ = 3% | ○ |

COMPARATIVE EXAMPLES 1, 2

Using fibrous hydrated titania ($TiO_2 \cdot \frac{1}{2}H_2O$, the average fiber length 12 μm, the average fiber diameter of 0.3 μm) as a raw material, composite fibrous calcium titanate and composite fibrous barium titanate were obtained in the same manner as the Example 1 and the Example 2, respectively.

COMPARATIVE EXAMPLES 3, 4

Using powdered $TiO_2$ (the average particle diameter of 0.2 μm) as a raw material, composite granular calcium titanate and composite granular barium titanate were obtained in the same manner as the Example 1 and the example 2, respectively.

The above described Examples 1 to 6, the Comparative examples 1 to 4 and a commercialized calcium titanate powder (CT produced by Fuji Titanium Industry Co., Ltd.) were kneaded with polyethylene resin in amount of 50% by weight filling amount and molded. Table 2 shows the measurement results of the dielectric constant values (1 MHz: capacity method=the electric field was in the direction of the thickness of the composites, 3G: cavity resonance method=the electric field was in the plane direction of the composites) and the mechanical strength of the obtained resin composites.

TABLE 2

|  | Dielectric Constant | | Mechanical Strength | |
|---|---|---|---|---|
|  | 1 MHz | 3 GHz | Tensile Strength (MPa) | Bending Strength (MPa) |
| Example 1 | 7.0 | 10.7 | 9 | 20 |
| Example 2 | 11.8 | 23.3 | 8 | 19 |
| Example 3 | 11.2 | 20.1 | 8 | 19 |
| Example 4 | 6.8 | 10.6 | 8 | 18 |
| Example 5 | 6.9 | 10.6 | 7 | 17 |
| Example 6 | 7.5 | 12.8 | 7 | 17 |
| Comparative Example 1 | 5.8 | 9.2 | 6 | 15 |
| Comparative Example 2 | 8.5 | 22.4 | 6 | 13 |
| Comparative Example 3 | 5.3 | 5.4 | 4 | 9 |
| Comparative Example 4 | 8.1 | 8.3 | 4 | 8 |
| Commercialized Calcium Titanate | 5.6 | 5.5 | 5 | 10 |

What is claimed is:

1. A composite plate-shaped metal titanate composed of a crystalline metal titanate having a composition $MO \cdot TiO_2$, wherein M denotes a divalent metal, and amorphous or crystalline $TiO_2$ partially or entirely coating the surface of the crystalline metal titanate.

2. The composite plate-shaped metal titanate according to claim 1, wherein the divalent metal denoted with M is at least one of alkaline earth metals selected from barium, strontium, calcium and magnesium.

3. The composite plate-shaped metal titanate according to claim 1, having the average major axial size of 0.5 to 100 μm, the average minor axial size of 0.2 to 100 μm, and the average thickness of 0.01 to 10 μm.

4. The composite plate-shaped metal titanate according to claim 1, having the average major axial size of 1 to 20 μm, the average minor axial size of 0.5 to 20 μm, and the average thickness of 0.05 to 5 μm.

5. A production method of a composite plate-shaped metal titanate according to claim 1 comprising steps of:

mixing plate-shaped titanium oxide with one or more metal compounds selected from the group consisting of oxides, hydroxides, inorganic acid salts, and organic acid salts of a divalent metal M in Ti>M by mole ratio, and carrying out heating treatment of the mixture at 500° C. to 1,400° C.

6. The production method of a composite plate-shaped metal titanate according to claim 5, wherein the mole ratio of Ti and M is adjusted to be M:Ti=1:1.02–1.67.

7. The composite plate-shaped metal titanate according to claim 2, having the average major axial size of 0.5 to 100 $\mu$m, the average minor axial size of 0.2 to 100 $\mu$m, and the average thickness of 0.01 to 10 $\mu$m.

8. The composite plate-shaped metal titanate according to claim 2, having the average major axial size of 1 to 20 $\mu$m, the average minor axial size of 0.5 to 20 $\mu$m, and the average thickness of 0.05 to 5 $\mu$m.

9. A composite plate-shaped metal titanate comprising:

a core having a surface, said core comprised of a crystalline metal titanate having a composition $MO \cdot TiO_2$, wherein M denotes a divalent metal, and an amorphous or crystalline $TiO_2$ partially or entirely coating the surface of the core.

* * * * *